(12) United States Patent
Kokorin (10) Patent No.: US 11,592,858 B1
(45) Date of Patent: Feb. 28, 2023

(54) FAST LCR METER WITH SUB-BALANCING

(71) Applicant: Oleksandr Kokorin, Sunnyvale, CA (US)

(72) Inventor: Oleksandr Kokorin, Sunnyvale, CA (US)

(*) Notice: Subject to any disclaimer, the term of this patent is extended or adjusted under 35 U.S.C. 154(b) by 0 days.

(21) Appl. No.: 17/873,889

(22) Filed: Jul. 26, 2022

Related U.S. Application Data

(62) Division of application No. 17/712,068, filed on Apr. 2, 2022.

(51) Int. Cl.
*G01R 35/00* (2006.01)
*G05F 5/00* (2006.01)

(52) U.S. Cl.
CPC ............ *G05F 5/00* (2013.01); *G01R 35/005* (2013.01)

(58) Field of Classification Search
CPC ................................ G05F 5/00; G01R 35/005
USPC ........................................................ 324/601
See application file for complete search history.

(56) References Cited

U.S. PATENT DOCUMENTS

| | | | | |
|---|---|---|---|---|
| 6,028,309 A * | 2/2000 | Parrish | ................. | H04N 5/3655 250/252.1 |
| 7,616,008 B1 | 11/2009 | Rayman et al. | | |
| 8,547,135 B1 * | 10/2013 | Yarlagadda | .......... | H03K 19/177 326/38 |
| 9,910,074 B2 | 3/2018 | Lindell et al. | | |
| 10,013,015 B2 | 7/2018 | Ida et al. | | |
| 2014/0348502 A1 * | 11/2014 | Miura | .................. | H04B 10/572 398/34 |
| 2020/0135441 A1 * | 4/2020 | Jones | ........................ | H03F 1/34 |
| 2021/0333348 A1 * | 10/2021 | Fortney | ................ | G01R 35/005 |

FOREIGN PATENT DOCUMENTS

CN 110320410 A 10/2019

OTHER PUBLICATIONS

Zhang et al. A Novel Fast Balance Technique for the Digital AC Bridge (Apr. 1998).
A History of Impedance Measurements by Henry P. Hall.
Keysight E4980A Precision LCR Meter Datasheet (2021).
Keysight Impedance Measurement Handbook 6th Ed (2021).

* cited by examiner

*Primary Examiner* — Tung X Nguyen
*Assistant Examiner* — Robert P Alejnikov, Jr.

(57) ABSTRACT

An LCR meter to increase accuracy of balancing uses sub-balancing method, additional to analog balancing by trans-impedance amplifier (TIA). For this, the LCR meter, based on TIA, to correct analog auto-balancing, applies the inverted voltage equal to unbalanced voltage to noninverting input of the TIA. And only one measurement of voltages is needed for.

1 Claim, 6 Drawing Sheets

FAST LCR METER WITH SUB-BALANCING

CROSS-REFERENCE TO RELATED APPLICATIONS

This application claims the benefit of nonprovisional patent application Ser. No. 17/712,068, filed 2022 Apr. 2 by the present inventor.

BACKGROUND OF THE INVENTION

U.S. Pats.

| Pat. No. | Kind Code | Issue Date | Patentee |
|---|---|---|---|
| 10,013,015 | B2 | 2018 Jul. 03 | Ida et al. |
| 9,910,074 | | 2018 Mar. 06 | Lindell et al. |
| 7,616,008 | | 2009 Nov. 10 | Rayman et al |

Foreign Patent Documents

| Foreign Doc. | Country Code | Publication Date | Patentee |
|---|---|---|---|
| 110320410A | CN | 2019 Oct. 11 | Fajie et al. |

Nonpatent Literature Documents

Nonpatent Literature Documents

Zhang et al. A Novel Fast Balance Technique for the Digital AC Bridge (April 1998)
A History of Impedance Measurements by Henry P. Hall
Keysight E4980A Precision LCR Meter Datasheet (2021)
Keysight Impedance Measurement Handbook 6th Ed (2021)

The main parameters of an LCR meter are accuracy and speed of measurements. The rate of measurements is essential if the LCR meter is used as part of an impedance analyzer or in production.

The impedance measurement is based on measuring voltage drops across a range resistor with known impedance and a device under test (DUT) placed in series. The impedance of the DUT is calculated by knowing the current through and voltage drop of the DUT.

Figure 1:
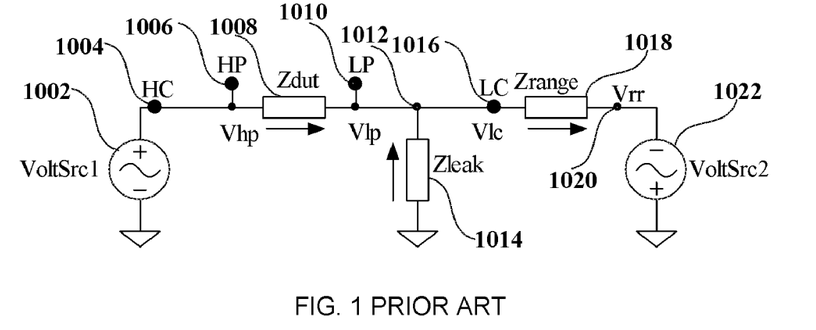
FIG. 1 shows the leading cause of inaccuracy in LCR meters.

In this case, the leading cause of an error (FIG. 1) is a leakage current through a leakage impedance between a middle point of the DUT and the range resistor to the ground. The leakage current is the reason for the non-equality of the currents through the range resistor and the DUT.

To decrease the leakage current, different methods are used.

One of them is a guard method, which helps to decrease voltage between the middle point and the shield in a cable to the DUT from the LCR meter's low potential (LP) terminal to the DUT by applying a voltage to the guard through a voltage follower. This method is used in Digital Impedance Meter ESI Model 251 "A History of Impedance Measurements by Henry P. Hall" p. 49.

Another method is an auto-balancing bridge by the trans-impedance amplifier (TIA). This method is used in the Digital Impedance Meter GR Type 1685-A "A History of Impedance Measurements by Henry P. Hall" p. 49.

Both these methods have instant action for balancing, but they have a low gain at high frequencies and, therefore, low common voltage suppression between the middle point and the shield of the cable. Also, they may have stability problems.

LCR meters with modem-type auto-balancing bridges have good balancing accuracy at high frequencies, as in Hewlett Packard 4271A LCR meter "A History of Impedance Measurements by Henry P. Hall" p. 49. But they include low-speed integrators that need a few periods of signal frequency for settling time and, for this reason, take long measurement time at low and medium frequencies. Also, they are expensive. A digital version of modem-type auto-balancing bridge exists in U.S. Pat. No. 7,616,008 B1 Rayman et al. (2009) but has the same flaw as the analog version, low speed at low and medium frequencies.

Some other digital methods exist, like in U.S. Pat. No. 10,013,015 B2 Ida et al. (2018), CN110320410A Fajie et al. (2019), "A Novel Fast Balance Technique for the Digital AC Bridge" Zhang et al. (1998). But all of them need at least two voltage measurements and at least two periods of signal frequency for balancing.

SUMMARY OF THE INVENTION

A trans-impedance amplifier (TIA) provides an analog method for fast balancing at a low cost. The TIA has instant balancing at low and medium frequencies. But the TIA has a low gain at high frequencies. As a result, a significant residual unbalanced voltage exists in the middle point between the DUT and the range resistor at high frequencies. The present invention uses the sub-balancing method to remove this residual unbalanced voltage. The sub-balancing method comprises the measurement of the unbalanced voltage and applying some voltage with inverted polarity from an additional digital-to-analog converter (DAC) to the non-inverting input of the TIA. It is a fast, non-iterative method of increasing accuracy. The LCR meter with the sub-balancing method needs only one measurement of voltages at high frequencies for balancing and has instant balancing at low and medium frequencies.

REFERENCE NUMERALS

1002 first voltage source (VoltSrc1).
1004 high current (HC) terminal.
1006 high potential (HP) terminal.
1008 device under test (DUT).
1010 low potential (LP) terminal.

1012 middle point between the DUT and the range resistor.
1014 leakage impedance (Zleak).
1016 low current (LC) terminal.
1018 range resistor (Zrange).
1020 voltage on the second terminal of the range resistor (Vrr).
1022 second voltage source (VoltSrc2).
3002 output impedance of the first voltage source (Zout1).
3004 impedance of series current limiting resistor (Zser_res).
3006 output impedance of the first voltage source's buffer (Zbuff1).
3008 impedance of the cable wire between the high current terminal and the device under test (Zwire1).
3010 capacitance of the cable between the HP terminal and the DUT (Ccable1).
3011 impedance of the cable wire between the LC terminal and the device under test (Zwire2).
3012 switch to connect the non-inverting input of the trans-impedance amplifier (TIA) either to the ground or to the second voltage source.
3014 trans-impedance amplifier (TIA).
3016 voltage on the output of the second voltage source (Vsb).
3018 switch to connect the second terminal of the range resistor either to the output of the TIA or to the output of the second voltage source.
3020 output impedance of second voltage source buffer (Zbuff2).
8010 high potential voltage input buffer.
8012 low potential voltage input buffer.
8014 low current voltage input buffer.
8016 range resistor voltage input buffer.
8018 second voltage source voltage input buffer.
8024 first voltage source output buffer.
8026 output buffer of the second voltage source.
8028 first low pass filter (LPF1).
8030 input multiplexer.
8032 output buffer of the multiplexer.
8033 control interface of the multiplexer.
8034 second low pass filter (LPF2).
8036 first digital-to-analog converter (DAC) (DAC1).
8038 first analog-to-digital converter (ADC) (ADC1).
8040 second DAC (DAC2).
8042 digital signal to the first DAC.
8044 digital signal from the first ADC.
8046 digital signal to the second DAC.
8048 processor.
9002 first set of memory buffers.
9004 second set of memory buffers.
9006 direct Fourier transform (DFT) block.
9008 cosine multiplier.
9010 sine multiplier.
9012 demultiplexer and accumulators.
9014 software direct digital synthesizer (DDS).
9016 controlling and processing core.
10002 common direct memory access (DMA) flowchart.
10004 direct Fourier transform processing for ADC data flowchart.
10006 DMA data preparation for DACs and reference buffers flowchart.

DETAILED DESCRIPTION

Figure 3:
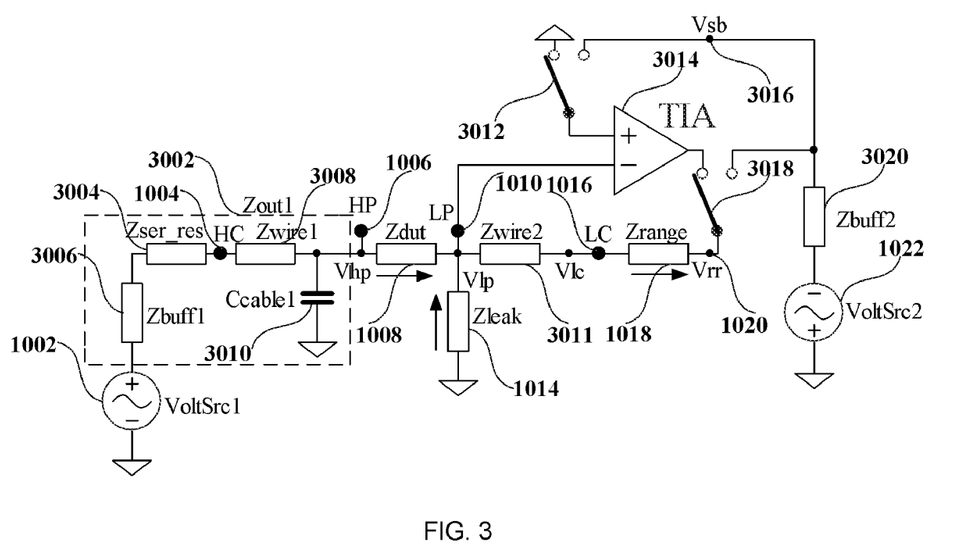
FIG. 3 shows a simplified diagram of the first embodiment of the present invention.

FIG. 3 shows a simplified diagram of the present invention. The present invention uses the trans-impedance amplifier (TIA) to set voltage in the middle point between the DUT and the range resistor close to zero to minimize the leakage current. The TIA has good instant balancing for low and medium frequencies. But the TIA has a low gain at high frequencies and, as a result, a significant residual unbalanced voltage.

The impedance measurement is based on Ohm law Zdut=Vdut/Idut. In the ideal case, the currents through the DUT and range resistor are equal Idut=Irr. But some residual unbalanced voltage Vlp in the middle point between the DUT and the range resistor is present. Therefore, a current through a leakage impedance Zleak also is present Ileak=Vlp/Zleak.

The leakage current gives an error in the impedance measurement. The present invention removes the error in two ways.

The first way is a sub-balancing method. The sub-balancing method is based on a property of an operational amplifier to have equal amplification for both inputs, inverting and non-inverting. To get the same output voltage, it does not matter to each input of the operational amplifier that the input voltage is applied. The only difference is the polarity of the input voltage. If the input voltage is applied to the inverting input, it must have the opposite polarity relative to the output voltage. If the input voltage is applied to the non-inverting input, it must have the same polarity relative to the output voltage. So, if measuring the voltage on the inverting input of the TIA, which is in steady mode, and applying the voltage with the same value, but opposite polarity to the non-inverting input of the TIA, then the voltage on the inverting input will become close to zero. And the current through the leak impedance also will become close to zero.

Applying the sub-balancing voltage changes the current through the DUT, the fixture, and the output impedance of the first voltage source. The new current through the DUT depends on the output impedance of the first voltage source and the parasitic impedances of the fixture. They are constant and may be measured on calibration time and saved to memory for use on measurement time. Knowing these impedances allows a more accurate calculation of the needed sub-balancing voltage. The second voltage source 1022 and switch 3012 provide this sub-balancing voltage. For this operation, only one additional measurement of voltages is necessary.

The second way is compensation of the leakage current. If the voltage drop on the leakage impedance is known, the leakage current may be calculated, and the actual current through the DUT may be gotten Idut=Irr−Ileak.

Figure 2:
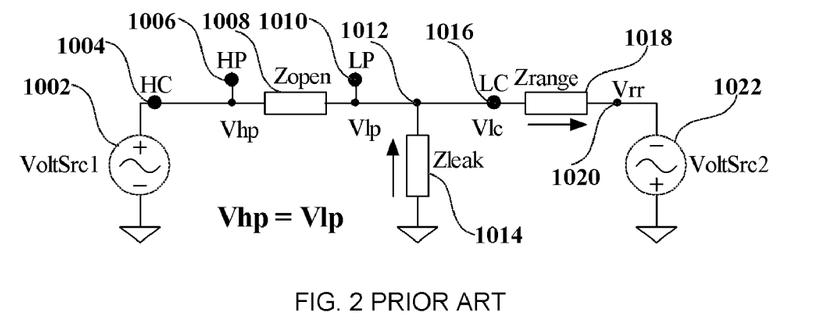
FIG. 2 shows a method of leakage impedance measurement.

Since the leakage impedance for the used fixture is constant, it may be measured on calibration time and saved to memory for use on measurement time. FIG. 2 shows the method of measuring the leakage impedance.

The leakage impedance is high at low and medium frequencies, and the TIA has minor balancing errors. But sub-balancing, even in one step, takes time. In this case, only the leakage compensation is necessary. The leakage compensation especially is important for infralow frequencies and very high DUT impedances when the sub-balancing alone is not enough to get high accuracy of measurements.

The sub-balancing and the leakage compensation are both necessary at high frequencies, especially with a long cable to the fixture.

First Embodiment

The first embodiment (FIG. 8) includes a processor 8048, which provides digital signals 8042 and 8046 to the first 1002 and the second 1022 voltage sources. The first embodiment also comprises DACs 8036 and 8040, low pass filters 8028 and 8034, and output buffers 8024 and 8026. The processor receives digital signal 8044 from an ADC 8038 and controls an analog multiplexer 9030.

The output of the first voltage source 1002, through its output impedance 3002 (FIG. 3), is connected to the DUT 1008. The output impedance 3002 includes output impedance 3006 of a buffer 8024, a series resistor 3004, a wire impedance 3008, and a capacitance of cables 3010 between the HC 1004 and HP 1006 terminals of the LCR meter and the DUT 1008.

One side of the DUT 1008 is connected to the HO terminal 1004 and the HP terminal 1006. Another side of the DUT 1008 is connected to the LP terminal 1010, the LC terminal 1016, and the first terminal of the range resistor 1018.

The first embodiment includes a TIA 3014 with the inverting input connected to the LP terminal 1010. The non-inverting input of the TIA is connected through a switch 3012 either to the ground or the output of the second voltage source. The first terminal of the range resistor 1018 is connected to the LC terminal 1016. The second terminal of the range resistor 1018 is connected through a switch 3018 either to the output of the TIA or to the output of the second voltage source. Switch 3018 is necessary for the leakage impedance measurement. This measurement is done by applying voltage from the second voltage source to the second terminal of the range resistor and measuring voltages on the LP terminal, the HP terminal, and both terminals of the range resistor.

Figure 8:
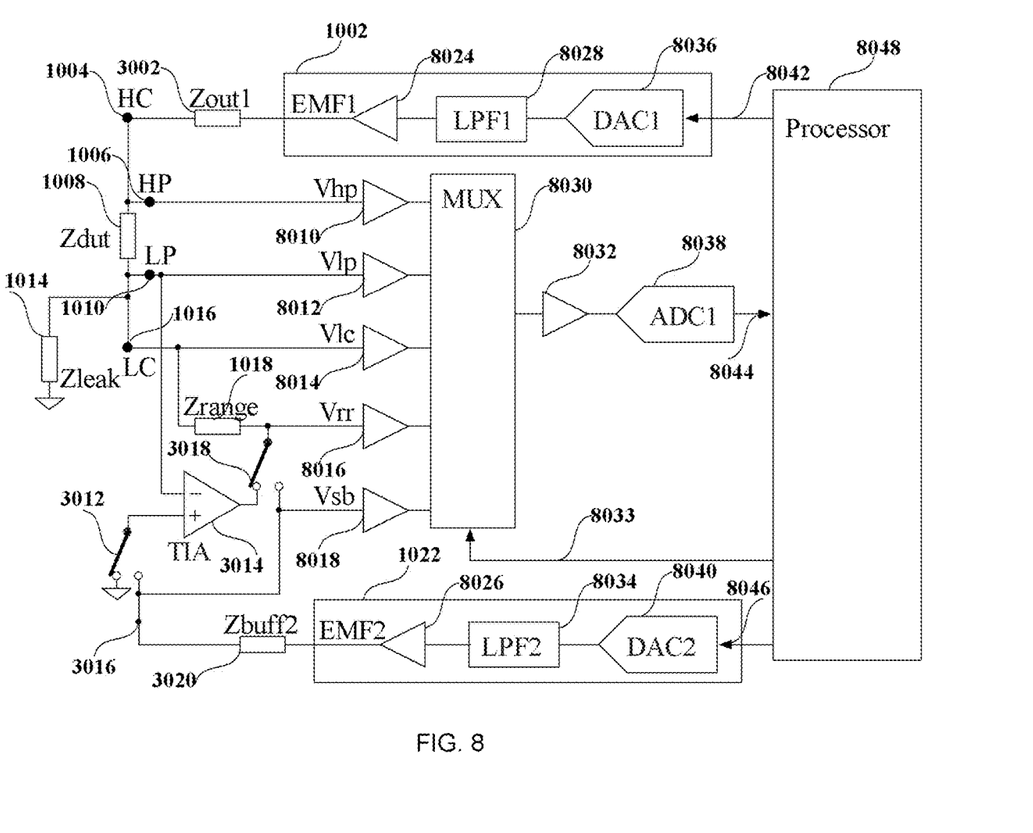
FIG. 8 shows a block diagram of the first embodiment of the present invention.

The HP terminal 1006 is connected to input buffer 8010. The LP terminal 1010 is connected to input buffer 8012. The first terminal of the range resistor 1018 is connected to input buffer 8014. The second terminal of the range resistor 1018 is connected to input buffer 8016. The output of the second voltage source 1022 is connected to input buffer 8018. The outputs of the input buffers 8010, 8012, 8014, 8016, and 8018 are connected to the inputs of the multiplexer 8030. The output of the multiplexer 8030 through a buffer 8032 is connected to the ADC 8038.

Operation of the First Embodiment

The leakage impedance and the series impedances are measured during open/short calibration in the first embodiment (FIG. 2, FIG. 3, FIG. 8).

The first embodiment may also use the guard to decrease voltage between the middle point and the cable's shield. In this case, all equations are the same; the only difference is that the leakage impedance is higher.

Leakage Calibration and Compensation

FIG. 2 shows a method of measurement of the leakage impedance.

The method includes:
  setting the open state of the fixture by removing a DUT;
  applying a predetermined voltage through a predetermined range resistor; measuring the voltage across the open fixture;
  eliminating the influence of the open fixture by setting the same voltage on the HP terminal as on the LP terminal and adjusting it in a predetermined number of iterations to get the closest values of these voltages to decrease the current through the open fixture;
  measuring the voltages across the leakage impedance and the range resistor;
  calculating the leakage impedance.

To set necessary voltages on the HP terminal, use the method in equations 22 and 23 for the calculation of a value of the input signal of the first voltage source.

For the leakage impedance calibration, switch 3018 must connect the second terminal of a range resistor to the second voltage source 1022.

$$Zleak = Vlp * Zrange/Vlc - Vrr \text{ The leakage impedance} \quad (1)$$

All values are complex.

While measuring the parameters of a DUT, the leakage impedance is used to calculate a leakage current and compensate for its influence by subtracting the current value through the leakage impedance from the current value through the range resistor (equations 7 . . . 9).

Calibration of Series Impedances

FIG. 3 shows a method of measurement of the series impedances, including the output impedance of the first 1002 voltage source and the impedance of the wire between the DUT and the low current terminal 3011. These impedances are necessary to calculate the precision sub-balancing voltage. These impedances are measured for the used fixture. Both open and short states of measurement circuitry are required to measure and calculate the series impedances. Both sets of all measured voltages, open and short, are saved and used for calculating the series impedances in the calibration process.

$$dI = Vlc_{short} - Vrr_{short}/Zrange + Vlp_{short}/Zleak \text{ The current change of the first voltage source} \quad (2)$$

$$Zout1 = Vhp_{open} - Vhp_{short}/dI \text{ The output impedance of the first voltage source} \quad (3)$$

$$Zwire2 = Vlp_{short} - Vlc_{short}/dI \text{ The impedance of the wire between the DUT and the LP terminal} \quad (4)$$

All values are complex.

Sub-Balancing Method

The first embodiment includes the TIA 3014, which performs instant analog auto-balancing. But the TIA has not enough gain at high frequencies to get an auto-balancing voltage equal to almost zero.

$$G_{opamp} = -Vrr/Vlp \text{ The gain of the operational amplifier used as TIA} \quad (5)$$

And input voltage $Vlp = -Vrr/G_{opamp}$ strongly depends on the gain of the TIA. This voltage is a residual unbalanced voltage. But if we apply to the non-inverting input of the TIA a voltage equal to the residual unbalanced voltage but with opposite polarity instead of zero voltage, the voltage on inverting input will become equal to almost zero. It is a "simplified sub-balancing." A more correct equation is $$Vsb = (Vrr - Vlp) * \frac{G_{opamp} + 1}{(G_{opamp})^2} \text{ The more correct sub-balancing voltage} \quad (6)$$

It is the "moderate sub-balancing" method. The method considers increasing a current through the range resistor after applying a sub-balancing voltage.

A more detailed description of "accurate sub-balancing" is lower.

The start conditions of the first embodiment (FIG. 8) are as follows:
  the first voltage source 1002 provides an excitation voltage;
  switch 3012 connects the non-inverting input of the TIA 3014 to the ground;

switch 3018 connects the second terminal of the range resistor 1018 to the output of the TIA;

the second voltage source 1022 provides a predetermined voltage Vsb 3016.

The voltage of the second voltage source is equal to the electro-moving force (EMF) if no load is present.

After all input voltages are measured, a needed sub-balancing voltage is calculated and applied to the non-inverting input of the TIA to get more accurate balancing (equations 7 ... 18).

$Irange=Vlc-Vrr/Zrange$ The current through the range resistor (7)

$Ileak=Irange-Ileak$ The current through the leakage impedance (8)

$Idut=Irange-Ileak$ The current through the DUT (9)

$Zdut=Vhp-Vlp/Idut$ The rough impedance of the DUT (10)

$G_{opamp}=Vrr/Vlp$ The gain of the operational amplifier used as TIA (11)

$EMF1=Vhp+Idut*Zout$ The electro-moving force (EMF) of the first voltage source (12)

$Idut_{New}=EMF1/Zdut+Zout1$ The new current through the DUT after Vlp=0 (13)

$Irange_{New}=Idut_{New}$ The new current through the range resistor for accurate balancing (14)

$Vrr_{New}=-Irange_{New}*(Zwire\ 2+Zrange)$ The new voltage on the range resistor (15)

$Vsb_{New} = \dfrac{Vrr_{New}}{G_{opamp}}$ The EMF of the second voltage source, no load (16)

$CorrCoeff=Vsb_{New}/Vsb$ The correcting coefficient for EMF of the second voltage source (17)

$S2_{New}=CorrCoeff*S2$ The new value of the digital signal 8046 for the second voltage source (18)

All values are complex.

Figure 7:
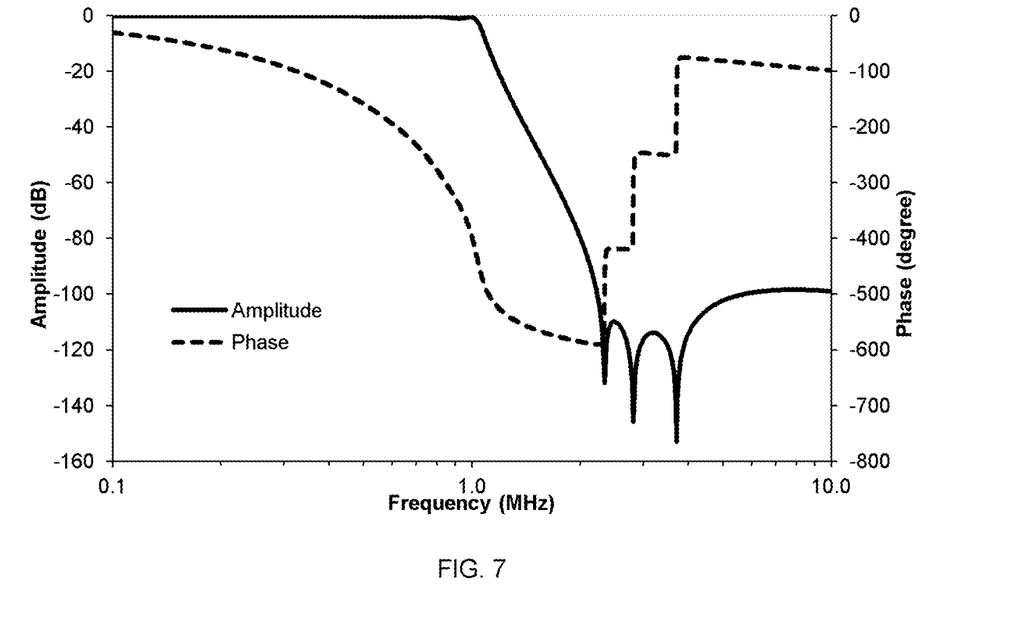
FIG. 7 shows a low-pass anti-aliasing filter's gain and phase frequency responses.

Calculating a correcting coefficient (CorrCoeff) as the relation between new and old EMFs is the implicit replacement of the explicit calculation of the low pass filter (LPF) frequency response. FIG. 7 shows an example of high-order LPF amplitude and phase frequency responses for an LCR meter with a maximal signal frequency of 1 MHz and sample frequency of 3 Msps. The calculation of the Corr-Coeff allows excluding the necessity of calibration of the LPFs with very steep slopes at high frequencies.

After applying the new digital signal S2$_{New}$ 8046, connecting the non-inverting input of the TIA to the second voltage source, the accurate DUT impedance can be measured. After measuring the voltages with the balanced conditions, repeat the calculation of the parameters of the DUT by using equations 7 ... 10.

Low-Level Processing

Figure 4:
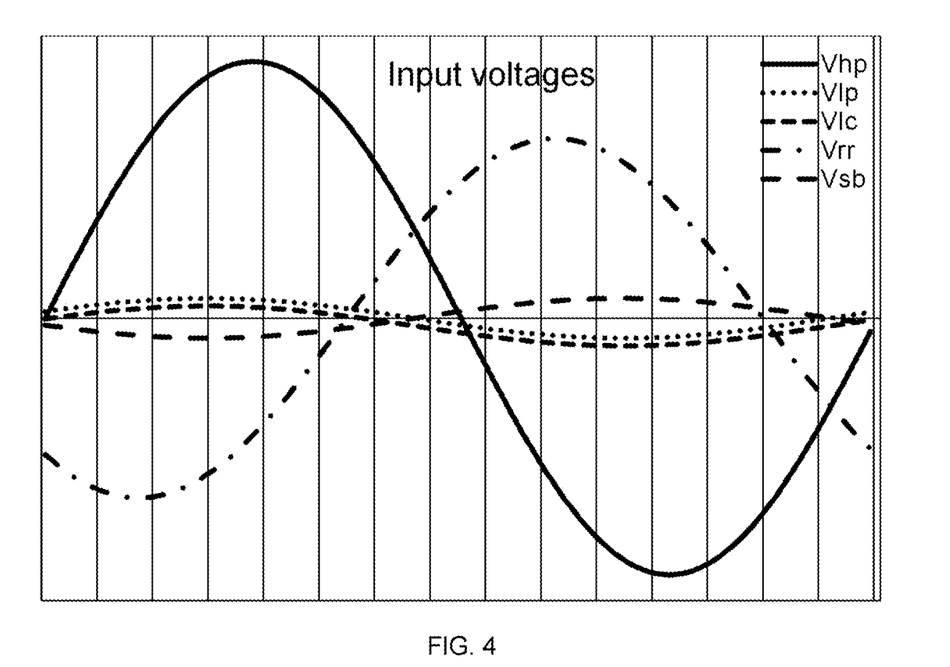
FIG. 4 shows an example of the input multiplexor's voltages of the LCR meter for one signal period.
Figure 5:
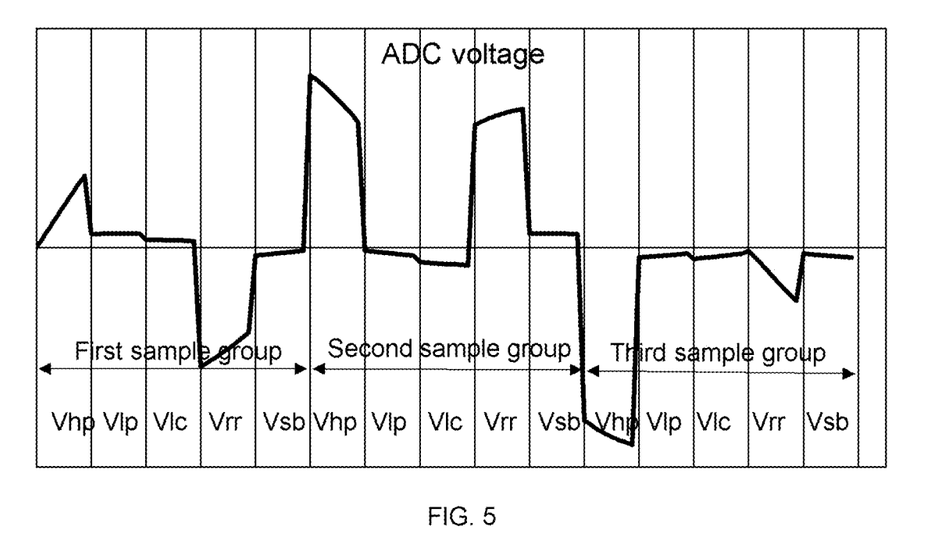
FIG. 5 shows the ADC1 input voltages for the first embodiment.

The first embodiment uses a structure with one ADC and a five-channel multiplexer to switch voltage channels for a lower cost. FIG. 4 shows input voltages, and FIG. 5 shows the voltages on the ADC input.

Figure 6:
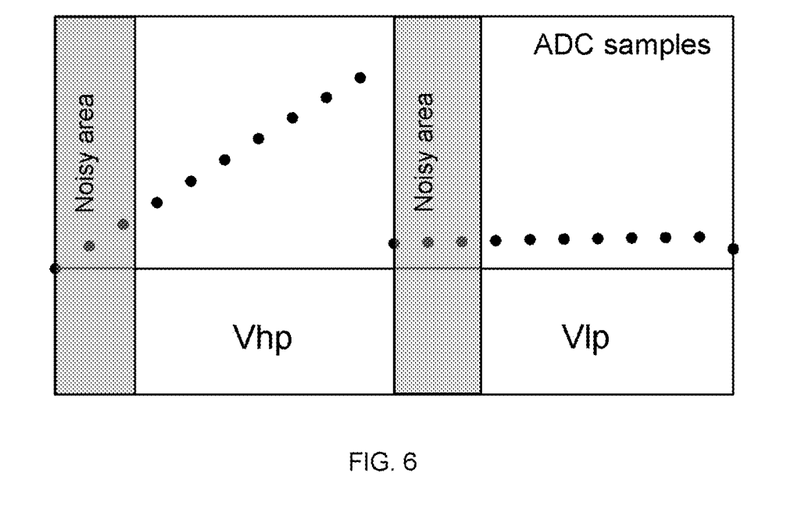
FIG. 6 shows the ADC1 input voltages for the first embodiment with more details.

Multiplexer's channels produce commutation noise, and noisy time intervals after the multiplexer's switching need to exclude from the ADC signal processing. FIG. 6 shows noisy and proper time intervals.

By the Nyquist theorem, the sampling frequency must be more than two times higher than the signal bandwidth. And to measure vector voltage by direct Fourier transform (DFT), at least one whole period of signal frequency is necessary. So, the minimum vector voltage measurement time is limited by one period of signal frequency and at least three ADC samples for every measured voltage. Therefore, all voltages must be measured simultaneously (FIG. 5), and at least three sample groups must be used. Equations 19 ... 23 describe the condition for low and medium frequencies if minimum measurement time is needed.

$Tsample=1/Fsample$ A sample period (19)

$Tsignal=1Fsignal$ A signal period (20)

$Tbuffer=Tsample*BufferSize$ A buffer time interval (21)

$Tsmpl\_gr=Tbuffer*Nchannels$ A sample group interval (22)

$Tmeas_{Minimum}=Tsignal=M*Tsmpl\_gr$ A minimum measurement time (23)

$(M \geq 3)$

All values are complex.

The BufferSize, the Nchannels, and the M are integer numbers. The BufferSize is the size of direct memory access (DMA) buffers, Nchannels is the number of voltage channels, and the M is the number of sample groups.

Figure 9:
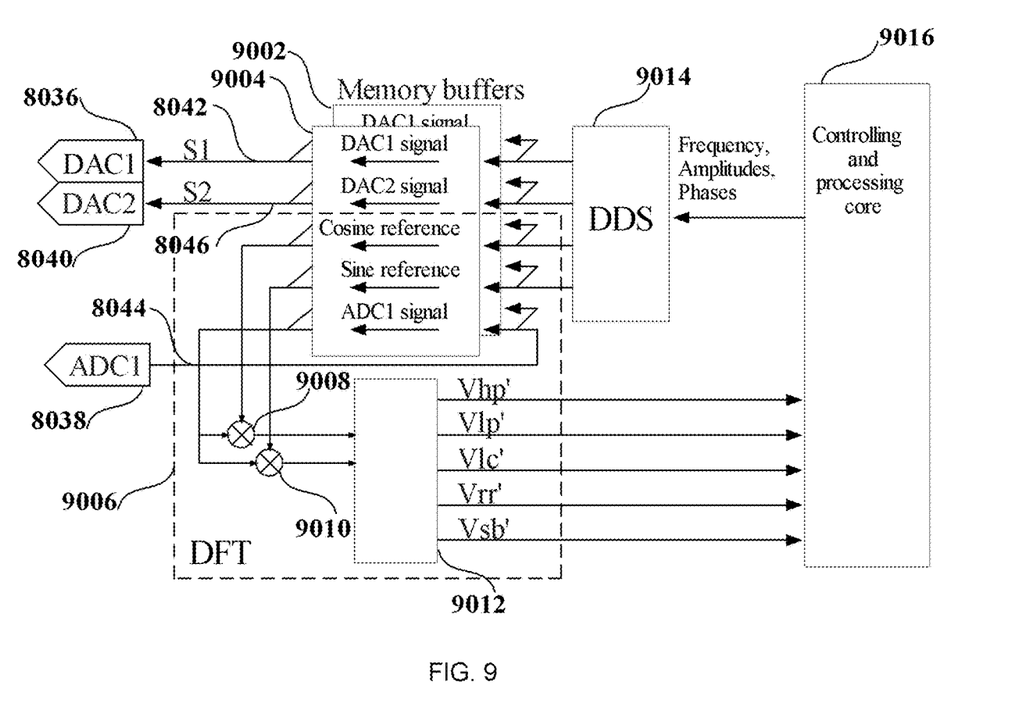
FIG. 9 shows a block diagram of low-level processing for the first embodiment.

FIG. 9 shows the first embodiment's signal processing with more details. Processor 8048 includes low-level processing of instant digital values of input and output voltages and high-level processing of digital representations of these voltages to calculate results in controlling and processing core 9016.

Low-level processing includes:

a direct digital synthesizer 9014;

first 9002 and second 9004 sets of memory buffers to store samples of input and output voltages, references' values;

multipliers for direct Fourier transform (DFT) 9008 and 9010;

a demultiplexer and accumulators 9012 to separate input voltage samples from different voltage channels and accumulate them in the DFT process;

interfaces to transfer digital signals S1 and S2 to DACs 8042 and 8046;

an interface to transmit digital signal from the ADC 8038 to memory 9002 and 9004. To speed up the processing, direct memory access (DMA) is used to transfer data from memory to DACs 8036 and 8040 and ADC 8038 to memory buffers 9002 and 9004.

Figure 10:
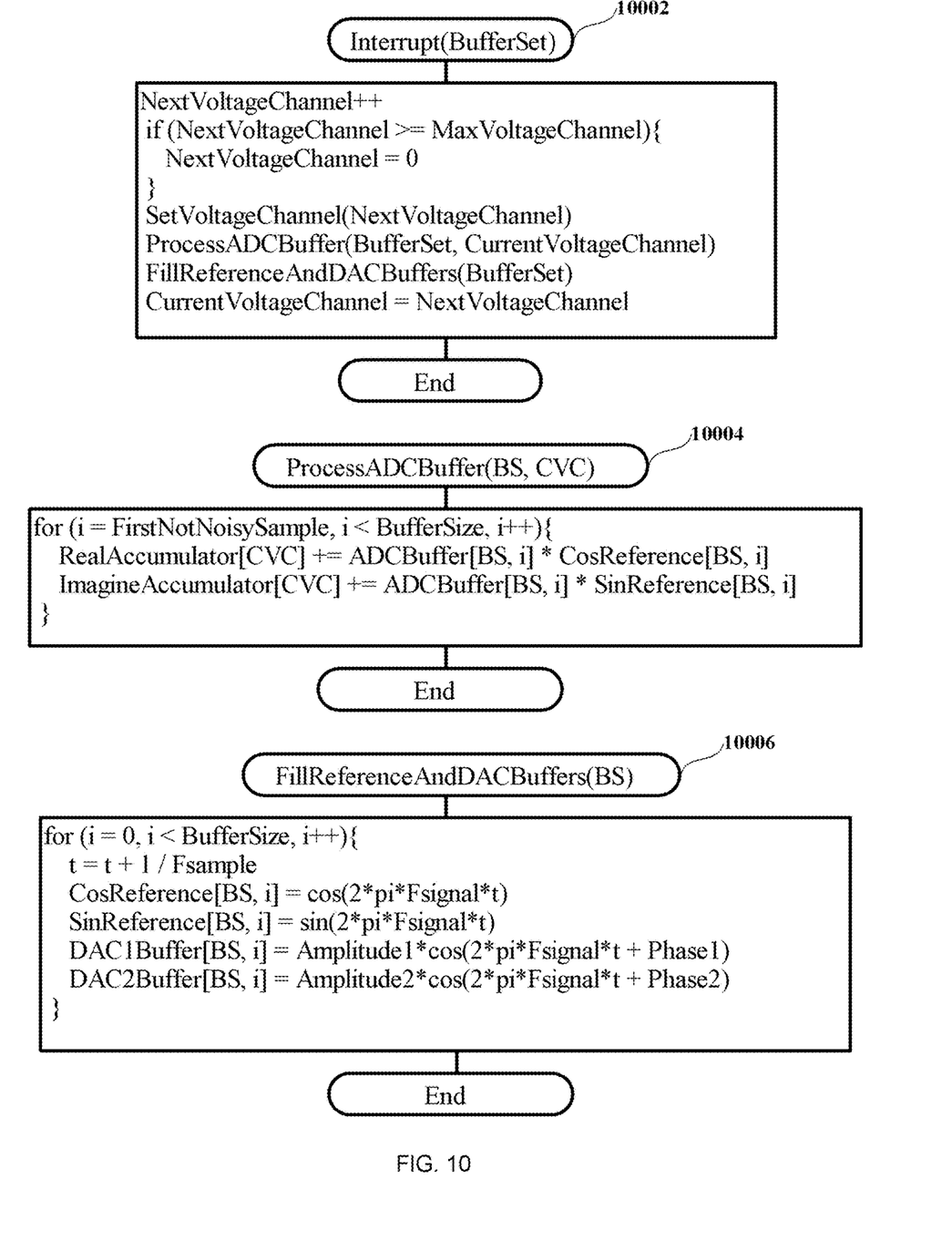
FIG. 10 shows a flowchart of a low-level work process of the processor.

Flowcharts in FIG. 10 show the data processing flow. First, data from ADC and reference data already filled in the previous DMA cycle are processed. These data are used for DFT. Second, data for the next DMA cycle are prepared. These data will be used for the DACs and the DFT. The reference data are filled together with the DACs data to save time during the DFT processing.

This processing is described for implementation in a processor, but it may also be implemented in microcontrollers, DSPs, FPGAs, ASICs, and other hardware.

First Embodiment Advantages

The first embodiment uses instant analog balancing, speeding up measuring at low and infra-low frequencies without sub-balancing and making accurate measuring with sub-balancing at high frequencies.

For better accuracy, the leakage compensation method decreases the influence of the residual unbalanced voltage.

Also, to increase the accuracy of the sub-balancing voltage calculation, the series impedances of a fixture and the first voltage source are used.

What is claimed is:

1. A sub-balancing method comprising:
providing an LCR meter having:
a high current (HC) terminal,
a high potential (HP) terminal,
a low potential (LP) terminal,
a low current (LC) terminal,
a fixture for connecting to a device under test (DUT),
a range resistor set of reference resistors with first and second terminals, which the said first terminal is being connected to said LC terminal,
a first voltage source, the output of said first voltage source is being connected to said HC terminal,
a second voltage source having an output,
a means to measure processor, said processor being capable of measuring voltages on said HP terminal, said LP terminal,
said LC terminal, said second terminal of said range resistor set of reference resistors, and said output of said second voltage source,
a trans-impedance amplifier (TIA), said TIA having an inverting input, a non-inverting input, and an output, said which inverting input being connected to said LP terminal, and
said output of said TIA being connected to
said second terminal of said range resistor set of reference resistors,
a switch, said switch connecting the non-inverting input of said TIA either to ground or the output of said second voltage source, and a processor;
attaching said fixture to a DUT;
connecting said fixture to said HC terminal, said HP terminal, said LP terminal, and said LC terminal;
connecting by said switch to connect the non-inverting input of said TIA to the ground;
setting a predetermined range resistor said set of reference resistors to a predetermined impedance;
setting the output of said first voltage source to a predetermined voltage on the output of said first voltage source;
setting the output of said second voltage source to a predetermined voltage on the output of said second voltage source;
measuring voltages at said HP terminal, said LP terminal, said LC terminal, the second terminal of said range resistor set of reference resistors, and the output of said second voltage source;
calculating a sub-balancing voltage that, when must be applied to the non-inverting input of said TIA to get would yield a zero voltage on said LP terminal;
setting the output of said second voltage source to said sub-balancing voltage on the output of said second voltage source;
connecting by said switch to connect the non-inverting input of said TIA to the output of said second voltage source;
measuring voltages at said HP terminal, said LP terminal, said LC terminal, and the second terminal of said range resistor set of reference resistors with said sub-balancing voltage applied to the non-inverting input of said TIA; and
calculating a value of said DUT impedance.

* * * * *

UNITED STATES PATENT AND TRADEMARK OFFICE
CERTIFICATE OF CORRECTION

PATENT NO. : 11,592,858 B1  
APPLICATION NO. : 17/873889  
DATED : February 28, 2023  
INVENTOR(S) : Oleksandr Kokorin

Page 1 of 1

It is certified that error appears in the above-identified patent and that said Letters Patent is hereby corrected as shown below:

In the Specification

Column 6, equation 1, after "/" insert --(--, after "Vrr" insert --)--;  
Column 6, equation 2, after "=" insert --(--, after "Vrrshort" insert --)--;  
Column 6, equation 3, after "=" insert --(--, after "Vhpshort" insert --)--;  
Column 6, equation 4, after "=" insert --(--, after "Vlcshort" insert --)--;  
Column 7, equation 7, after "=" insert --(--, after "Vrr" insert --)--;  
Column 7, equation 10, after "=" insert --(--, after "Vlp" insert --)--;  
Column 7, equation 13, after "/" insert --(--, after "Zout1" insert --)--;  
Column 8, equation 20, after "=1" insert --/--.

Signed and Sealed this  
Tenth Day of September, 2024

Katherine Kelly Vidal  
*Director of the United States Patent and Trademark Office*